US012652887B2

(12) United States Patent
Lu et al.

(10) Patent No.: US 12,652,887 B2
(45) Date of Patent: Jun. 9, 2026

(54) LIGHTING DEVICE HAVING HIGH LUMINOUS-EFFICIENCY LAYOUT STRUCTURE

(71) Applicant: Xiamen PVTECH Co., Ltd., Xiamen (CN)

(72) Inventors: Fuxing Lu, Xiamen (CN); Zhirong Lin, Xiamen (CN); Zhentao Li, Xiamen (CN); Yuan Li, Xiamen (CN)

(73) Assignee: Xiamen PVTECH Co., Ltd., Xiamen (CN)

( * ) Notice: Subject to any disclaimer, the term of this patent is extended or adjusted under 35 U.S.C. 154(b) by 389 days.

(21) Appl. No.: 18/232,369

(22) Filed: Aug. 10, 2023

(65) Prior Publication Data

US 2024/0332456 A1    Oct. 3, 2024

(30) Foreign Application Priority Data

Mar. 29, 2023    (CN) .......................... 202310322539.8

(51) Int. Cl.
| | |
|---|---|
| *H01H 29/14* | (2006.01) |
| *F21V 23/00* | (2015.01) |
| *H05B 45/10* | (2020.01) |
| *H10H 20/83* | (2025.01) |
| *H10H 29/14* | (2025.01) |
| *H10H 20/01* | (2025.01) |

(52) U.S. Cl.
CPC ............. *H10H 20/83* (2025.01); *H05B 45/10* (2020.01); *H10H 29/142* (2025.01); *H10H 20/0364* (2025.01)

(58) Field of Classification Search
CPC .............................. H10H 29/142; F21V 23/00
USPC ....................................................... 362/217.01
See application file for complete search history.

(56) References Cited

U.S. PATENT DOCUMENTS

| | | | | |
|---|---|---|---|---|
| 11,536,419 | B1 * | 12/2022 | Lu | .............................. F21K 9/60 |
| 2015/0285474 | A1 | 10/2015 | Martin | |
| 2019/0098719 | A1 | 3/2019 | Ono | |

FOREIGN PATENT DOCUMENTS

| | | |
|---|---|---|
| CN | 104704927 A | 6/2015 |
| CN | 105805616 A | 7/2016 |

(Continued)

*Primary Examiner* — Toan C Ly

(74) *Attorney, Agent, or Firm* — BruceStone LLP; Joseph A. Bruce

(57) ABSTRACT

A lighting device includes a light source positive electrode, light source negative electrode, driving power source, substrate, first connecting portion, second connecting portion and light-emitting module. The driving power source has a power source positive electrode and power source negative electrode. The substrate has a light source connecting portion and electrical connecting portion connected to each other. The electrical connecting portion is connected to the power source negative electrode. One end of the first connecting portion is connected to the power source positive electrode. The two ends of the second connecting portion are connected to the other end of the first connecting portion and the light source positive electrode. The light-emitting module includes a first light source module and a second light source module. The first light source module and the second light source module are connected to the light source positive electrode and the light source connecting portion.

10 Claims, 6 Drawing Sheets

(56) References Cited

FOREIGN PATENT DOCUMENTS

| CN | 109155344 | A | 1/2019 |
| CN | 114234137 | A | 3/2022 |
| KR | 20160002065 | U | 6/2016 |
| WO | 2017/203989 | A1 | 11/2017 |

* cited by examiner

LIGHTING DEVICE HAVING HIGH LUMINOUS-EFFICIENCY LAYOUT STRUCTURE

BACKGROUND OF THE INVENTION

1. Field of the Invention

The present invention relates to a lighting device, in particular to a lighting device having high luminous-efficiency layout structure.

2. Description of the Prior Art

Currently, if the length of a currently available lighting device is greater than 1.5 meters, this lighting device is usually formed by splicing several substrates with each other. However, the currently available splicing method still has several shortcomings to be improved. First, the currently available splicing method tends to result in uneven light emission of the lighting device and incur obvious light spots (bright areas and dark areas arranged in staggered arrangement), which reduces the visual effect and comfort of the lighting device. In addition, the currently available splicing method cannot make the most of the light-emitting diodes, so the light efficiency of the lighting device is low, which leads to serious energy waste. Further, the currently available splicing method needs to use several substrates of different sizes, which tends to result in excess inventory of the substrates and influence production efficiency. Thus, the production cost and time of the lighting devices are increased.

US Patent Publication No. US20150285474 and US Patent Publication No. US20160186940 disclose the technical contents related to the layout structures or circuit designs of lighting devices, but still cannot solve the above problems of the prior art.

SUMMARY OF THE INVENTION

One embodiment of the present invention discloses a lighting device having high luminous-efficiency layout structure, which includes a light source positive electrode, a light source negative electrode, a substrate, a first connecting portion, a second connecting portion and a light-emitting module. The driving power source has a power source positive electrode and a power source negative electrode. The substrate has a light source connecting portion and an electrical connecting portion. The light source connecting portion is connected to the electrical connecting portion, and the electrical connecting portion is connected to the power source negative electrode. One end of the first connecting portion is connected to the power source positive electrode. One end of the second connecting portion is connected to the other end of the first connecting portion and the other end thereof is connected to the light source positive electrode. The light-emitting module includes a first light source module and a second light source module. One end of the first light source module and one end of the second light source module are connected to the light source positive electrode. The other end of the first light source module and the other end of the second light source module are connected to the light source connecting portion.

In one embodiment of the present invention, the first light source module includes a first connecting wiring and a plurality of first light sources. The first connecting wiring includes a plurality of first connecting sections and a plurality of first light-emitting sections. The first connecting sections and the first light-emitting sections are arranged in stagger arrangement. Each of the first connecting sections protrudes from a first reference line in a first direction and each of the first light-emitting sections protrudes from the first reference line in a second direction. The first light sources are disposed on the first light-emitting sections respectively.

In one embodiment of the present invention, the second light source module includes a second connecting wiring and a plurality of second light sources. The second connecting wiring includes a plurality of second light-emitting sections and a plurality of second connecting sections. The second connecting sections and the second light-emitting sections are arranged in stagger arrangement. Each of the second light-emitting sections protrudes from the second reference line in the first direction and each of the second connecting sections protrudes from the second reference line in the second direction. The second light sources are disposed on the second light-emitting sections respectively. The second light-emitting sections are corresponding to the first connecting sections respectively.

In one embodiment of the present invention, the light-emitting module further includes a third light source module, and the third light source module includes a third connecting wiring and a plurality of third light sources. The third connecting wiring comprises a plurality of third light-emitting sections and a plurality of third connecting sections. The third light-emitting sections and the third connecting sections are arranged in the stagger arrangement. Each of the third light-emitting sections protrudes from a third reference line in the second direction and each of the third connecting sections protrudes from the third reference line in the first direction. The third light sources are disposed on the third light-emitting sections respectively. The third light-emitting sections are corresponding to the second light-emitting sections respectively.

In one embodiment of the present invention, the light-emitting module further includes a fourth light source module, and the fourth light source module includes a fourth connecting wiring and a plurality of fourth light sources. The fourth connecting wiring includes a plurality of fourth connecting sections and a plurality of fourth light-emitting sections. The fourth connecting sections and the fourth light-emitting sections are arranged in stagger arrangement. Each of the fourth connecting sections protrudes from a fourth reference line in the second direction and each of the fourth light-emitting sections protrudes from the fourth reference line in the first direction. The fourth light sources are disposed on the fourth light-emitting sections respectively. The fourth light-emitting sections are corresponding to the third connecting sections respectively.

In one embodiment of the present invention, the first reference line, the second reference line, the third reference line and the fourth reference line are parallel to each other.

In one embodiment of the present invention, the first direction is contrary to the second direction.

In one embodiment of the present invention, the impedance of the first light source module, the impedance of the second light source module, the impedance of the third light source module and the impedance of the fourth light source module are equal to each other.

In one embodiment of the present invention, the first light sources, the second light sources, the third light sources and the fourth light sources are light-emitting diodes.

In one embodiment of the present invention, the driving power source is a light-emitting diode driver.

The lighting device having high luminous-efficiency layout structure in accordance with the embodiments of the present invention may have the following advantages:

(1) In one embodiment of the present invention, the lighting device includes a substrate and a light-emitting module having several light source modules disposed on the substrate, which can form a plurality of light-emitting circuits. In addition, the lighting device further has a first connecting portion and a second connecting portion. The substrate, the first connecting portion and the second connecting portion are specially designed, such that the total impedances of these light-emitting circuits are equal to each other. In this way, the luminous efficiency of the lighting device can be significantly enhanced, so the light emitted by the lighting device can be more uniform and does not generate obvious light spots (bright areas and dark areas arranged in staggered arrangement). Accordingly, the visual effect and conform of the lighting device can be effectively improved.

(2) In one embodiment of the present invention, the lighting device has the first connecting portion, the second connecting portion, the substrate and the light source modules, and which are specially designed. The above structure can form a high luminous-efficiency layout structure in order to make the most of the light-emitting diodes (LEDs). Therefore, the luminous efficiency of the lighting device can be greatly enhanced, so the lighting device can save more energy so as to meet the future development trend.

(3) In one embodiment of the present invention, the layout structure of the lighting device can achieve high luminous efficiency in order to make the most of the LEDs. Accordingly, the luminous efficiency of the lighting device can be greatly enhanced with a view to improving the overall performance of the lighting device. As a result, the lighting device can be more comprehensive in application and conform to actual requirements.

(4) In one embodiment of the present invention, the lighting device includes the substrate and the light-emitting module having several light source modules disposed on the substrate, which can form several light-emitting circuits. Besides, several substrates can be spliced with each other. Thus, the production of the lighting device only needs the substrates of a single size, which will not result in excess inventory of the substrates and can increase production efficiency. Thus, the production cost and time of the lighting device can be reduced. Thus, the overall cost of the lighting device can be decreased.

(5) In one embodiment of the present invention, the design of the lighting device is simple, so the lighting device can achieve the desired technical effects without significantly increasing the cost thereof. Therefore, the lighting device can have high commercial value.

Further scope of applicability of the present application will become more apparent from the detailed description given hereinafter. However, it should be understood that the detailed description and specific examples, while indicating exemplary embodiments of the present invention, are given by way of illustration only, since various changes and modifications within the spirit and scope of the present invention will become apparent to those skilled in the art from this detailed description.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION

Figure 1:
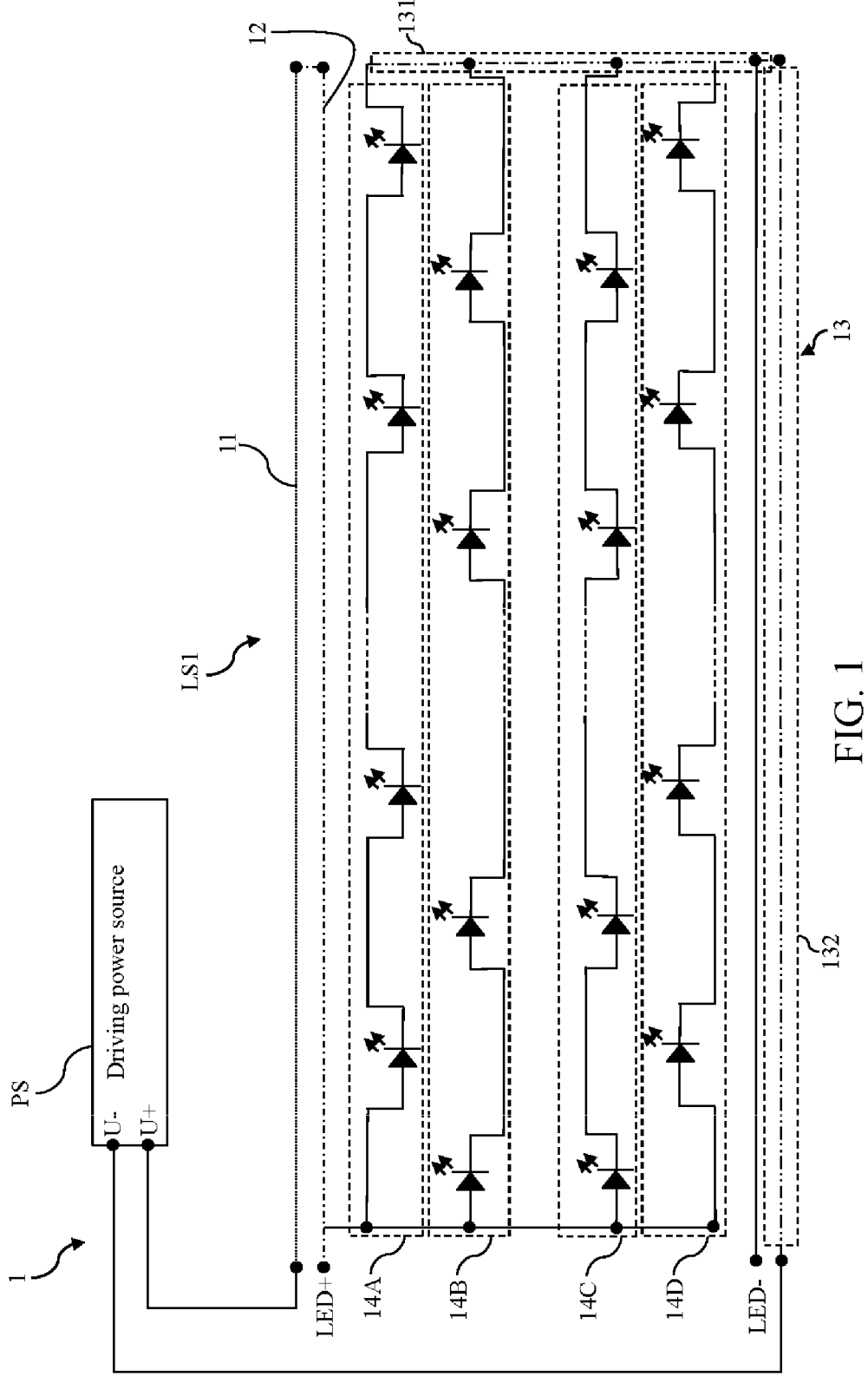
FIG. 1 is a circuit diagram of a lighting device having high luminous-efficiency layout structure in accordance with one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Please refer to FIG. 1, which is a circuit diagram of a lighting device having high luminous-efficiency layout structure in accordance with one embodiment of the present invention. As shown in FIG. 1, the lighting device 1 includes a driving power source PS and a first light source board LS1. The first light source board LS1 includes a light source positive electrode LED+, a light source negative electrode LED−, a first connecting portion 11, a second connecting portion 12, a substrate 13 and a light-emitting module. The light source positive electrode LED+, the light source negative electrode LED−, the substrate 13, the first connecting portion 11 and the second connecting portion 12 and the light-emitting module forms the first light source board LS1. The lighting device 1 may be a portable lighting device, such as a flashlight, a portable searchlight, etc. Alternatively, the lighting device 1 may also be a lamp fixed on the ceiling (or wall) of a building.

The driving power source PS has a power source positive electrode U+ and a power source negative electrode U−. In one embodiment, the driving power source PS may be a light-emitting diode (LED) driver. In another embodiment, the driving power source PS may also be a driver for a fluorescent lamp, a bulb or other currently available light sources.

The substrate 13 (shown by two-dot chain lines) has a light source connecting portion 131 and an electrical connecting portion 131. The light source connecting portion 131 is connected to the electrical connecting portion 132, and the electrical connecting portion 132 is connected to the power source negative electrode U−.

One end of the first connecting portion 11 (shown by the thin broken lines) is connected to the power source positive electrode U+. In one embodiment, the first connecting portion 11 may be any one of currently available conductive wires.

One end of the second connecting portion 11 (shown by the one-dot chain lines) is connected to the other end of the first connecting portion 11 and the other end thereof is connected to the light source positive electrode LED+. In one embodiment, the second connecting portion 12 may be any one of currently available conductive wires.

The light-emitting module includes a first light source module 14A, a second light source module 14B, a third light source module 14C and a fourth light source module 14D. One end of the first light source module 14A is connected to the light source positive electrode LED+ and the other end of the first light source module 14A is connected to the light source connecting portion 131. One end of the second light source module 14B is connected to the light source positive electrode LED+ and the other end of the second light source module 14B is connected to the light source connecting portion 131. One end of the third light source module 14C is connected to the light source positive electrode LED+ and the other end of the third light source module 14C is connected to the light source connecting portion 131. One end of the fourth light source module 14D is connected to the light source positive electrode LED+ and the other end of the fourth light source module 14D is connected to the light source connecting portion 131. In this way, the driving power source PS can drive the light-emitting module (including the first light source module 14A, the second light source module 14B, the third light source module 14C and the fourth light source module 14D).

In addition, the impedance of the first light source module 14A, the impedance of the second light source module 14B, the impedance of the third light source module 14C and the impedance of the fourth light source module 14D are equal to each other.

Thus, the total impedance of the first light-emitting circuit formed by the first connecting portion 11, the second connecting portion 12, the first light source module 14A and the substrate 13 is as shown in Equation (1):

$$M1 = RA1 + RB1 + Ra + RA2 \qquad (1)$$

In Equation (1), M1 stands for the total impedance of the first light-emitting circuit; RA1 stands for the impedance of the first connecting portion 11; RB1 stands for the impedance of the second connecting portion 12; Ra stands for the impedance of the first light source module 14A; RA2 stands for the impedance of the substrate 13.

The total impedance of the second light-emitting circuit formed by the first connecting portion 11, the second connecting portion 12, the second light source module 14B and the substrate 13 is as shown in Equation (1):

$$M2 = RA1 + RB1 + Rb + RA2 \qquad (2)$$

In Equation (1), M2 stands for the total impedance of the second light-emitting circuit; Rb stands for the impedance of the second light source module 14B.

The total impedance of the third light-emitting circuit formed by the first connecting portion 11, the second connecting portion 12, the third light source module 14C and the substrate 13 is as shown in Equation (3):

$$M3 = RA1 + RB1 + Rc + RA2 \qquad (3)$$

In Equation (1), M3 stands for the total impedance of the third light-emitting circuit; Rc stands for the impedance of the third light source module 14C.

The total impedance of the fourth light-emitting circuit formed by the first connecting portion 11, the second connecting portion 12, the fourth light source module 14D and the substrate 13 is as shown in Equation (4):

$$M2 = RA1 + RB1 + Rd + RA2 \qquad (4)$$

In Equation (1), M4 stands for the total impedance of the fourth light-emitting circuit; Rd stands for the impedance of the fourth light source module 14D.

As set forth above, the impedance Ra of the first light source module 14A, the impedance Rb of the second light source module 14B, the impedance Rc of the third light source module 14C and the impedance Rd of the fourth light source module 14D are equal to each other (i.e., Ra=Rb=Rc=Rd). Therefore, the total impedance M1 of the first light-emitting circuit, the total impedance M2 of the second light-emitting circuit, the total impedance M3 of the third light-emitting circuit and the total impedance M4 of the fourth light-emitting circuit are also equal to each other (i.e., M1=M2=M3=M4).

Thus, the lighting device 1 includes the substrate 13 and the light-emitting module having several light source modules (the first light source module 14A, the second light source module 14B, the third light source module 14C and the fourth light source module 14D) disposed on the substrate 13, which can form several light-emitting circuits (the first light-emitting circuit, the second light-emitting circuit, the third light-emitting circuit and the fourth light-emitting circuit). In addition, the lighting device 1 further has the first connecting portion 11 and the second connecting portion 12. The substrate 13, the first connecting portion 11 and the second connecting portion 12 are specially designed, such that the total impedances of these light-emitting circuits are equal to each other. In this way, the luminous efficiency of the lighting device 1 can be significantly enhanced, so the light emitted by the lighting device 1 can be more uniform and does not generate obvious light spots (bright areas and dark areas arranged in staggered arrangement). Accordingly, the visual effect and conform of the lighting device 1 can be effectively improved. Further, the lighting device 1 can save more energy, so the lighting device 1 can be more comprehensive in application so as to conform to actual requirements.

Moreover, the lighting device 1 includes the substrate 13 and the light-emitting module having several light source modules (the first light source module 14A, the second light source module 14B, the third light source module 14C and the fourth light source module 14D) disposed on the substrate 13, which can form several light-emitting circuits (the first light-emitting circuit, the second light-emitting circuit, the third light-emitting circuit and the fourth light-emitting circuit). Besides, several substrates 13 can be spliced with each other. Thus, the production of the lighting device 1 only needs the substrates 13 of a single size, which will not result in excess inventory of the substrates 13 and can increase production efficiency. Thus, the production cost and time of the lighting device 1 can be reduced. Thus, the overall cost of the lighting device 1 can be decreased.

The embodiment just exemplifies the present invention and is not intended to limit the scope of the present invention; any equivalent modification and variation according to the spirit of the present invention is to be also included within the scope of the following claims and their equivalents.

Figure 2:
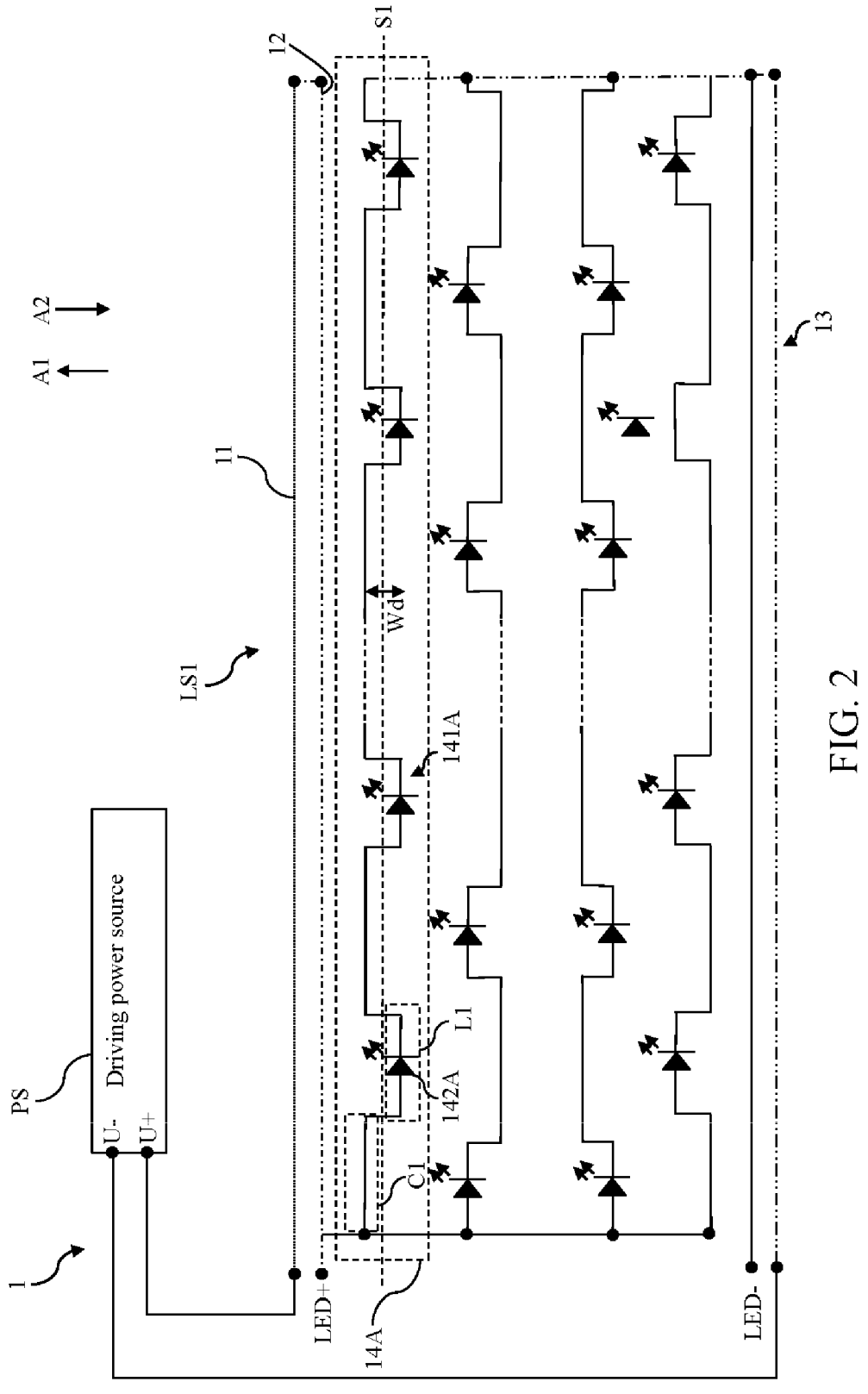
FIG. 2 is a first schematic view of the lighting device having high luminous-efficiency layout structure in accordance with one embodiment of the present invention.

Please refer to FIG. 2, which is a first schematic view of the lighting device having high luminous-efficiency layout structure in accordance with one embodiment of the present invention. As shown in FIG. 2, the first light source module 14A includes a first connecting wiring 141A and a plurality of first light sources 142A. The first connecting wiring 141A includes a plurality of first connecting section C1 and a plurality of first light-emitting sections L1. The first connecting sections C1 and the first light-emitting sections L1 are arranged in stagger arrangement. The width of the first connecting wiring 141A is Wd. Each of the first connecting sections C1 protrudes from a first reference line S1 in a first direction A1 and each of the first light-emitting sections L1 protrudes from the first reference line S1 in a second direction A2. The first direction A1 is contrary to the second direction A2, which can be changed according to actual requirements. The first light sources 142A are disposed on the first light-emitting sections L1 respectively. The first reference line S1 penetrates through the connecting point between any one of the first connecting sections C1 and the first light-emitting section L1 adjacent thereto. The above layout structure makes the first light source module 14A forms a continuous square wave.

The embodiment just exemplifies the present invention and is not intended to limit the scope of the present invention; any equivalent modification and variation according to the spirit of the present invention is to be also included within the scope of the following claims and their equivalents.

Figure 3:
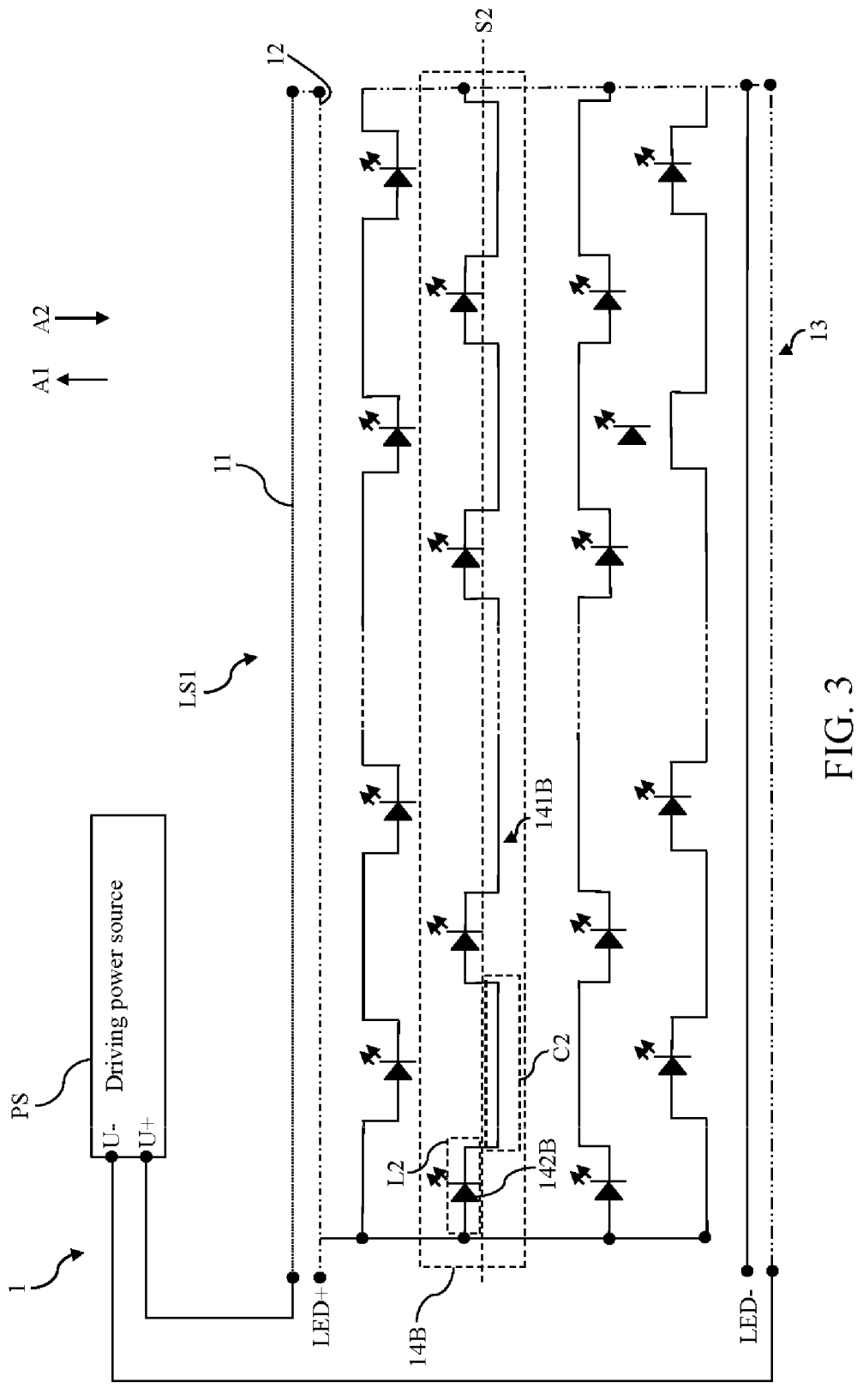
FIG. 3 is a second schematic view of the lighting device having high luminous-efficiency layout structure in accordance with one embodiment of the present invention.

Please refer to FIG. 3, which is a second schematic view of the lighting device having high luminous-efficiency layout structure in accordance with one embodiment of the present invention. As shown in FIG. 3, the second light source module 14B includes a second connecting wiring 141B and a plurality of second light sources 142B. The second connecting wiring 141B includes a plurality of second light-emitting sections L2 and a plurality of second connecting section C2. The second connecting sections C2 and the second light-emitting sections L2 are arranged in stagger arrangement. Each of the second light-emitting sections L2 protrudes from a second reference line S2 in the first direction A1 and each of the second connecting sections C1 protrudes from the second reference line S2 in the second direction A2. The second light sources 142B are disposed on the second light-emitting sections L2 respectively, and the second light-emitting sections L2 are corresponding to the first connecting sections C1 respectively. The second reference line S2 penetrates through the connecting point between any one of the second connecting sections C2 and the second light-emitting section L2 adjacent thereto. The above layout structure makes the second light source module 14B forms a continuous square wave.

The embodiment just exemplifies the present invention and is not intended to limit the scope of the present invention; any equivalent modification and variation according to the spirit of the present invention is to be also included within the scope of the following claims and their equivalents.

Figure 4:
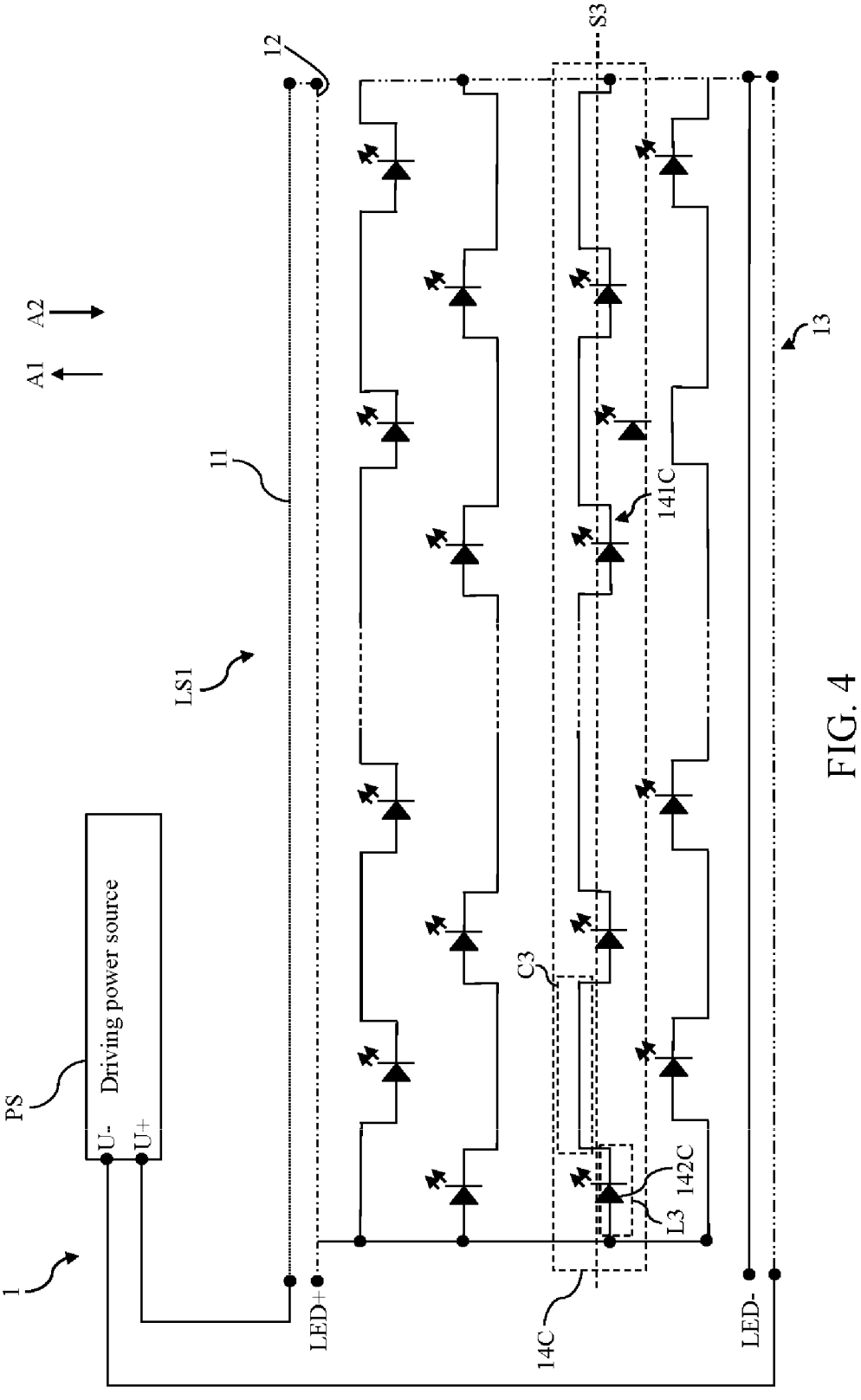
FIG. 4 is a third schematic view of the lighting device having high luminous-efficiency layout structure in accordance with one embodiment of the present invention.

Please refer to FIG. 4, which is a third schematic view of the lighting device having high luminous-efficiency layout structure in accordance with one embodiment of the present invention. As shown in FIG. 4, the third light source module 14C includes a third connecting wiring 141C and a plurality of third light sources 142C. The third connecting wiring 141C includes a plurality of third light-emitting sections L3 and a plurality of third connecting section C3. The third connecting sections C3 and the third light-emitting sections L3 are arranged in stagger arrangement. Each of the third light-emitting sections L3 protrudes from a third reference line S3 in the second direction A2 and each of the third connecting sections C3 protrudes from the third reference line S3 in the first direction A1. The third light sources 142C are disposed on the third light-emitting sections L3 respectively, and the third light-emitting sections L3 are corresponding to the second light-emitting sections L2 respectively. The third reference line S3 penetrates through the connecting point between any one of the third connecting sections C3 and the third light-emitting section L3 adjacent thereto. The above layout structure makes the third light source module 14C forms a continuous square wave.

The embodiment just exemplifies the present invention and is not intended to limit the scope of the present invention; any equivalent modification and variation according to the spirit of the present invention is to be also included within the scope of the following claims and their equivalents.

Figure 5:
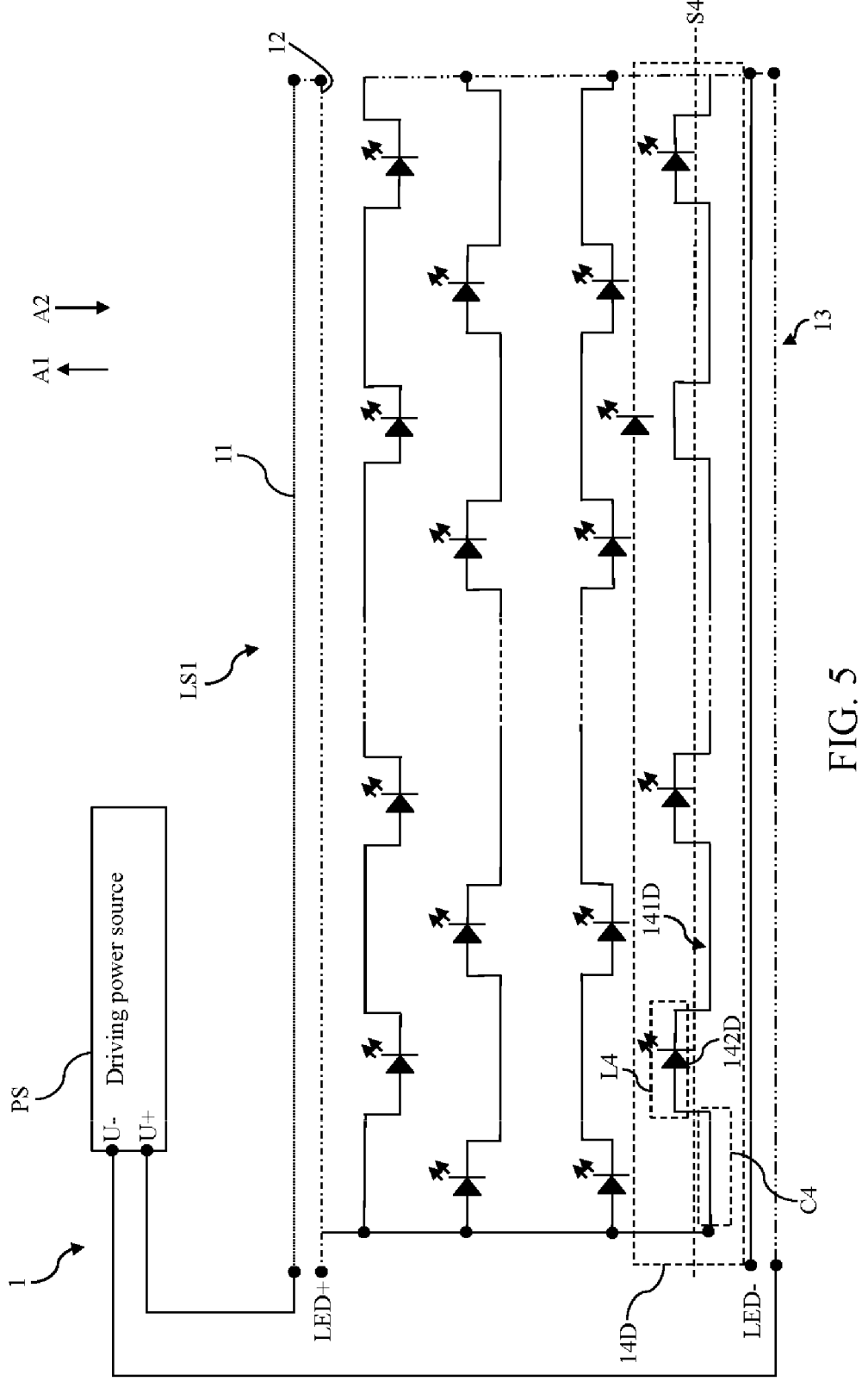
FIG. 5 is a fourth schematic view of the lighting device having high luminous-efficiency layout structure in accordance with one embodiment of the present invention.

Please refer to FIG. 5, which is a fourth schematic view of the lighting device having high luminous-efficiency layout structure in accordance with one embodiment of the present invention. As shown in FIG. 5, the fourth light source module 14D includes a fourth connecting wiring 141D and a plurality of fourth light sources 142D. The fourth connecting wiring 141D includes a plurality of fourth connecting section C4 and a plurality of fourth light-emitting sections L4. The fourth connecting sections C4 and the fourth light-emitting sections L4 are arranged in stagger arrangement. Each of the fourth connecting sections C4 protrudes from a fourth reference line S4 in the second direction A2 and each of the fourth light-emitting sections L4 protrudes from the fourth reference line S4 in the first direction A1. The fourth light sources 142D are disposed on the fourth light-emitting sections L4 respectively, and the fourth light-emitting sections L4 are corresponding to the third connecting sections C3 respectively. The fourth reference line S4 penetrates through the connecting point between any one of the fourth connecting sections C4 and the fourth light-emitting section L4 adjacent thereto. The above layout structure makes the fourth light source module 14D forms a continuous square wave.

In one embodiment, the first light sources 142A, the second light sources 142B, the third light sources 142C and the fourth light sources 142D are light-emitting diodes (LEDs). In another embodiment, the first light sources 142A, the second light sources 142B, the third light sources 142C and the fourth light sources 142D may be fluorescent lamps, bulbs or other currently available light sources.

The width of the first connecting wiring 141A, the width of the second connecting wiring 141B, the width of the third connecting wiring 141C and the width of the fourth connecting wiring 141D are equal to each other. In other words, the width of the second connecting wiring 141B, the width of the third connecting wiring 141C and the width of the fourth connecting wiring 141D are also Wd. The total length of the first connecting wiring 141A, the total length of the second connecting wiring 141B, the total length of the third connecting wiring 141C and the total length of the fourth connecting wiring 141D are equal to each other.

As described above, the first light source module 14A, the second light source module 14B, the third light source module 14C and the fourth light source module 14D have a special layout structure. As a result, the impedance of the first light source module 14A, the impedance of the second light source module 14B, the impedance of the third light source module 14C and the impedance of the fourth light source module 14D are equal to each other in order to achieve impedance matching. The above layout structure can integrate the first connecting portion 11, the second connecting portion 12 and the substrate 13 with each other so as to evenly distribute the current over the first light source module 14A, the second light source module 14B, the third light source module 14C and the fourth light source module 14D, which can enhance the overall luminous efficiency of the lighting device 1. In this way, the visual effect and comfort of the light emitted by the lighting device 1 can be effectively enhanced.

The embodiment just exemplifies the present invention and is not intended to limit the scope of the present invention; any equivalent modification and variation according to the spirit of the present invention is to be also included within the scope of the following claims and their equivalents.

It is worthy to point out that the currently available splicing method tends to result in uneven light emission of the lighting device and incur obvious light spots (bright areas and dark areas arranged in staggered arrangement), which reduces the visual effect and comfort of the lighting device. In addition, the currently available splicing method cannot make the most of the light-emitting diodes, so the light efficiency of the lighting device is low, which leads to serious energy waste. Further, the currently available splicing method needs to use several substrates of different sizes, which tends to result in excess inventory of the substrates and influence production efficiency. Thus, the production cost and time of the lighting devices are increased. On the contrary, according to one embodiment of the present invention, the lighting device includes a substrate and a light-emitting module having several light source modules disposed on the substrate, which can form a plurality of light-emitting circuits. In addition, the lighting device further has a first connecting portion and a second connecting portion. The substrate, the first connecting portion and the second connecting portion are specially designed, such that the total impedances of these light-emitting circuits are equal to each other. In this way, the luminous efficiency of the lighting device can be significantly enhanced, so the light emitted by the lighting device can be more uniform and does not generate obvious light spots (bright areas and dark areas arranged in staggered arrangement). Accordingly, the visual effect and conform of the lighting device can be effectively improved.

Also, according to one embodiment of the present invention, the lighting device has the first connecting portion, the second connecting portion, the substrate and the light source modules, and which are specially designed. The above structure can form a high luminous-efficiency layout structure in order to make the most of the light-emitting diodes (LEDs). Therefore, the luminous efficiency of the lighting device can be greatly enhanced, so the lighting device can save more energy so as to meet the future development trend.

Further, according to one embodiment of the present invention, the layout structure of the lighting device can achieve high luminous efficiency in order to make the most of the LEDs. Accordingly, the luminous efficiency of the lighting device can be greatly enhanced with a view to improving the overall performance of the lighting device. As a result, the lighting device can be more comprehensive in application and conform to actual requirements.

Moreover, according to one embodiment of the present invention, the lighting device includes the substrate and the light-emitting module having several light source modules disposed on the substrate, which can form several light-emitting circuits. Besides, several substrates can be spliced with each other. Thus, the production of the lighting device only needs the substrates of a single size, which will not result in excess inventory of the substrates and can increase production efficiency. Thus, the production cost and time of the lighting device can be reduced. Thus, the overall cost of the lighting device can be decreased.

Furthermore, according to one embodiment of the present invention, the design of the lighting device is simple, so the lighting device can achieve the desired technical effects without significantly increasing the cost thereof. Therefore, the lighting device can have high commercial value. As described above, the lighting device having high luminous-efficiency layout structure according to the embodiments of the present invention can definitely achieve great technical effects.

Figure 6:
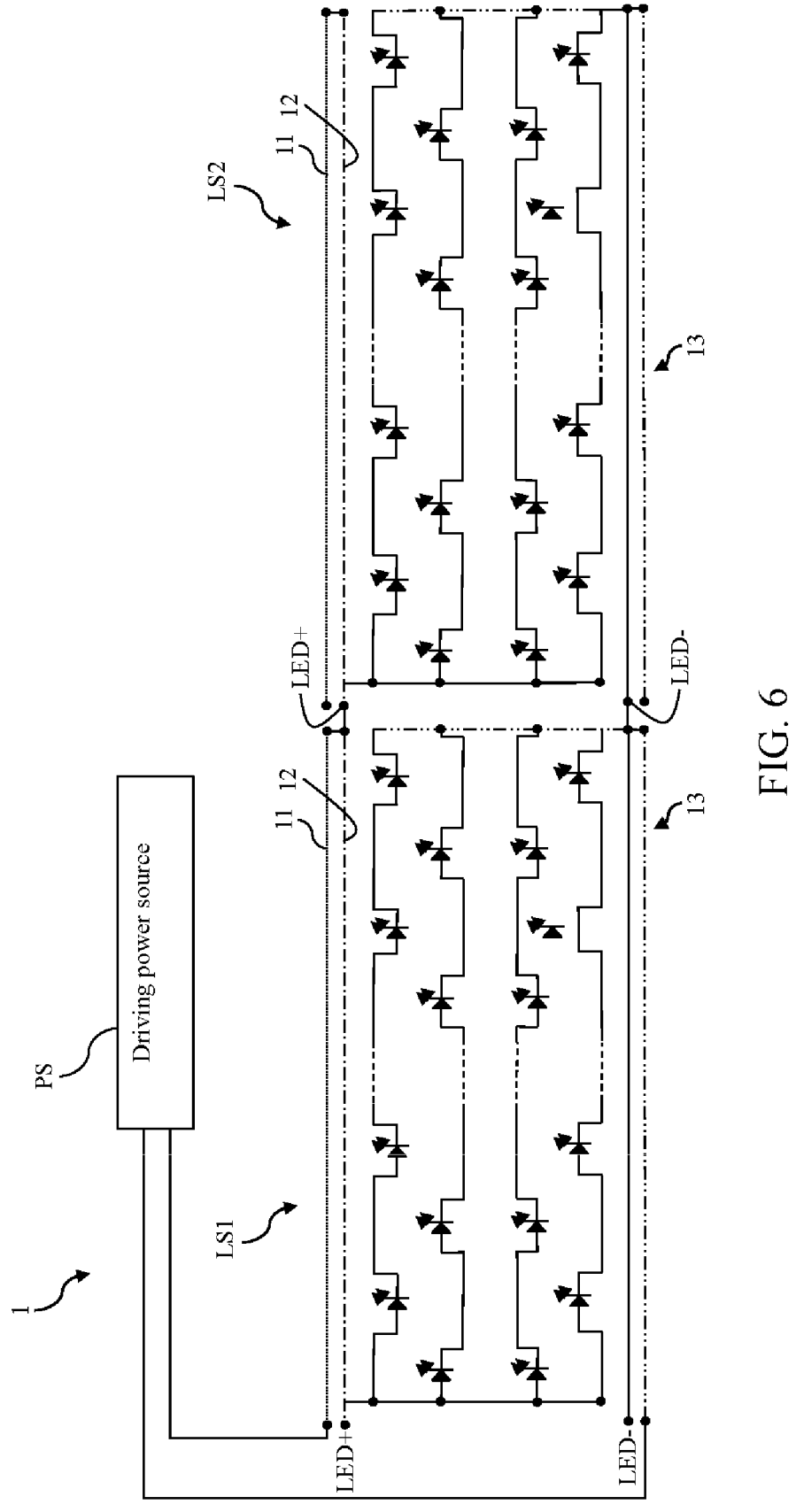
FIG. 6 is a schematic view of a lighting device having high luminous-efficiency layout structure in accordance with another embodiment of the present invention.

Please refer to FIG. 6, which is a schematic view of a lighting device having high luminous-efficiency layout structure in accordance with another embodiment of the present invention. Please also refer to FIG. 1-FIG. 5. As shown in FIG. 6, the lighting device 1 includes a driving power source PS, a first light source board LS1 and a second light source board LS2. The first light source board LS1 includes a light source positive electrode LED+, a light source negative electrode LED−, a first connecting portion 11, a second connecting portion 12, a substrate 13 and a light-emitting module. The structure of the first light source board LS1 is similar to that of the previous embodiment (please refer to FIG. 1-FIG. 5), so will not be described herein again. The structure of the second light source board LS2 is similar to that of the first light source board LS1.

As shown in FIG. 6, the second connecting portion 12 of the first light source board LS1 can be connected to the second connecting portion 12 of the second light source board LS2 (by welding or other fixing methods). The light source negative electrode LED− of the first light source board LS1 can be also connected to the light source negative electrode LED− of the second light source board LS2. Therefore, several substrates 13 can be spliced with each other to form the lighting device 1.

As previously stated, the lighting device 1 includes the substrate 13 and the light-emitting module having several light source modules disposed on the substrate 13, which can form several light-emitting circuits. Besides, several substrates 13 can be spliced with each other. Thus, the production of the lighting device 1 only needs the substrates 13 of a single size, which will not result in excess inventory of the substrates 13 and can increase production efficiency. Thus, the production cost and time of the lighting device 1 can be reduced. Thus, the overall cost of the lighting device 1 can be decreased.

The embodiment just exemplifies the present invention and is not intended to limit the scope of the present invention; any equivalent modification and variation according to the spirit of the present invention is to be also included within the scope of the following claims and their equivalents.

To sum up, according to one embodiment of the present invention, the lighting device includes a substrate and a light-emitting module having several light source modules disposed on the substrate, which can form a plurality of light-emitting circuits. In addition, the lighting device further has a first connecting portion and a second connecting portion. The substrate, the first connecting portion and the second connecting portion are specially designed, such that the total impedances of these light-emitting circuits are equal to each other. In this way, the luminous efficiency of the lighting device can be significantly enhanced, so the light emitted by the lighting device can be more uniform and does not generate obvious light spots (bright areas and dark areas arranged in staggered arrangement). Accordingly, the visual effect and conform of the lighting device can be effectively improved.

Also, according to one embodiment of the present invention, the lighting device has the first connecting portion, the second connecting portion, the substrate and the light source modules, and which are specially designed. The above structure can form a high luminous-efficiency layout structure in order to make the most of the light-emitting diodes (LEDs). Therefore, the luminous efficiency of the lighting device can be greatly enhanced, so the lighting device can save more energy so as to meet the future development trend.

Further, according to one embodiment of the present invention, the layout structure of the lighting device can achieve high luminous efficiency in order to make the most of the LEDs. Accordingly, the luminous efficiency of the lighting device can be greatly enhanced with a view to improving the overall performance of the lighting device. As a result, the lighting device can be more comprehensive in application and conform to actual requirements.

Moreover, according to one embodiment of the present invention, the lighting device includes the substrate and the light-emitting module having several light source modules disposed on the substrate, which can form several light-emitting circuits. Besides, several substrates can be spliced with each other. Thus, the production of the lighting device only needs the substrates of a single size, which will not result in excess inventory of the substrates and can increase production efficiency. Thus, the production cost and time of the lighting device can be reduced. Thus, the overall cost of the lighting device can be decreased.

Furthermore, according to one embodiment of the present invention, the design of the lighting device is simple, so the lighting device can achieve the desired technical effects without significantly increasing the cost thereof. Therefore, the lighting device can have high commercial value.

It will be apparent to those skilled in the art that various modifications and variations can be made to the disclosed embodiments. It is intended that the specification and examples be considered as exemplary only, with a true scope of the present invention being indicated by the following claims and their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lighting device having high luminous-efficiency layout structure, comprising:

a light source positive electrode;

a light source negative electrode;

a driving power source having a power source positive electrode and a power source negative electrode;

a substrate having a light source connecting portion and an electrical connecting portion, wherein the light source connecting portion is connected to the electrical connecting portion, and the electrical connecting portion is connected to the power source negative electrode, but is not connected to the power source positive electrode;

a first connecting portion, wherein one end thereof is connected to the power source positive electrode;

a second connecting portion arranged side by side with the first connecting portion, wherein one end thereof is connected to another end of the first connecting portion and another end thereof is connected to the light source positive electrode; and a light-emitting module comprising a first light source module and a second light source module, wherein one end of the first light source module and one end of the second light source module are connected to the light source positive electrode, and another end of the first light source module and another end of the second light source module are connected to the light source connecting portion;

wherein an impedance of the first light source module and an impedance of the second light source module are equal to each other, whereby a total impedance of a first light-emitting circuit formed by the first connecting portion, the second connecting portion, the first light source module and the substrate is equal to a total impedance of a second light-emitting circuit formed by the first connecting portion, the second connecting portion, the second light source module and the substrate.

2. The lighting device having high luminous-efficiency layout structure as claimed in claim 1, wherein the first light source module comprises a first connecting wiring and a plurality of first light sources, wherein the first connecting wiring comprises a plurality of first connecting sections and a plurality of first light-emitting sections, and the first connecting sections and the first light-emitting sections are arranged in a stagger arrangement, wherein each of the first connecting sections protrudes from a first reference line in a first direction and each of the first light-emitting sections protrudes from the first reference line in a second direction, and the first light sources are disposed on the first light-emitting sections respectively.

3. The lighting device having high luminous-efficiency layout structure as claimed in claim 2, wherein the second light source module comprises a second connecting wiring and a plurality of second light sources, wherein the second connecting wiring comprises a plurality of second light-emitting sections and a plurality of second connecting sections, and the second connecting sections and the second light-emitting sections are arranged in the stagger arrangement, wherein each of the second light-emitting sections protrudes from the second reference line in the first direction and each of the second connecting sections protrudes from the second reference line in the second direction, wherein the second light sources are disposed on the second light-emitting sections respectively, and the second light-emitting sections are corresponding to the first connecting sections respectively.

4. The lighting device having high luminous-efficiency layout structure as claimed in claim 3, wherein the light-emitting module further comprises a third light source module, and the third light source module comprises a third connecting wiring and a plurality of third light sources, wherein the third connecting wiring comprises a plurality of third light-emitting sections and a plurality of third connecting sections, and the third light-emitting sections and the third connecting sections are arranged in the stagger arrangement, wherein each of the third light-emitting sections protrudes from a third reference line in the second direction and each of the third connecting sections protrudes from the third reference line in the first direction, wherein the third light sources are disposed on the third light-emitting sections respectively, and the third light-emitting sections are corresponding to the second light-emitting sections respectively.

5. The lighting device having high luminous-efficiency layout structure as claimed in claim 4, wherein the light-emitting module further comprises a fourth light source module, and the fourth light source module comprises a fourth connecting wiring and a plurality of fourth light sources, wherein the fourth connecting wiring comprises a plurality of fourth connecting sections and a plurality of fourth light-emitting sections, and the fourth connecting sections and the fourth light-emitting sections are arranged in the stagger arrangement, wherein each of the fourth connecting sections protrudes from a fourth reference line in the second direction and each of the fourth light-emitting sections protrudes from the fourth reference line in the first direction, wherein the fourth light sources are disposed on the fourth light-emitting sections respectively, and the fourth light-emitting sections are corresponding to the third connecting sections respectively.

6. The lighting device having high luminous-efficiency layout structure as claimed in claim 5, wherein the first reference line, the second reference line, the third reference line and the fourth reference line are parallel to each other.

7. The lighting device having high luminous-efficiency layout structure as claimed in claim 5, wherein the first direction is contrary to the second direction.

8. The lighting device having high luminous-efficiency layout structure as claimed in claim 5, wherein the impedance of the first light source module, the impedance of the second light source module, an impedance of the third light source module and an impedance of the fourth light source module are equal to each other.

9. The lighting device having high luminous-efficiency layout structure as claimed in claim 5, wherein the first light sources, the second light sources, the third light sources and the fourth light sources are light-emitting diodes.

10. The lighting device having high luminous-efficiency layout structure as claimed in claim 1, wherein the driving power source is a light-emitting diode driver.

* * * * *